United States Patent
Chan

(10) Patent No.: US 8,823,011 B2
(45) Date of Patent: Sep. 2, 2014

(54) HIGH LINEARITY BANDGAP ENGINEERED TRANSISTOR

(75) Inventor: Richard T. Chan, Nashua, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 435 days.

(21) Appl. No.: 13/211,530

(22) Filed: Aug. 17, 2011

(65) Prior Publication Data

US 2013/0043482 A1    Feb. 21, 2013

(51) Int. Cl.
*H01L 29/12* (2006.01)
*H01L 29/786* (2006.01)

(52) U.S. Cl.
CPC .... *H01L 29/78681* (2013.01); *H01L 29/78618* (2013.01)
USPC ............ 257/76; 257/192; 257/E29.255

(58) Field of Classification Search
None
See application file for complete search history.

(56) References Cited

U.S. PATENT DOCUMENTS 5,759,908 A * 6/1998 Steckl et al. .......... 438/479
5,767,549 A * 6/1998 Chen et al. ............ 257/347

OTHER PUBLICATIONS

Wilson et al., The Simulation of Wide Band Gap Semiconductor Materials for Use in High Temperature and Other Applications, Dec. 1995, The Stimulation Standard, pp. 10-11.

* cited by examiner

*Primary Examiner* — Wensing Kuo
(74) *Attorney, Agent, or Firm* — Finch & Maloney PLLC; Neil F. Maloney

(57) ABSTRACT

A high linearity bandgap engineered transistor device is provided. In one example configuration, the device generally includes a substrate and an oxide layer formed on the substrate. The device further includes a wide-bandgap body material formed between a portion of the oxide layer and a gate dielectric layer. The wide-bandgap body material has an energy bandgap of 1.35 eV or higher and is lattice matched to the substrate. The device further includes a source-drain material formed on the oxide layer adjacent to the wide-bandgap body material so as to define a hetero-structure interface where the source-drain material contacts the wide-bandgap body material. The wide-bandgap body material is also lattice matched to the source-drain material. The device further includes a gate material formed over the gate dielectric layer. Other features and variations will be apparent in light of this disclosure.

20 Claims, 8 Drawing Sheets

HIGH LINEARITY BANDGAP ENGINEERED TRANSISTOR

FIELD OF THE DISCLOSURE

The invention relates to integrated circuitry, and more particularly, to a high linearity bandgap engineered transistor structure.

BACKGROUND

Scaling in sub-micron technology nodes for metal oxide semiconductor field effect transistors (MOSFET) continues. Such scaling gives rise to a number of non-trivial and not well-understood issues, such as those related to switching speed and power handling capabilities.

SUMMARY

One embodiment of the present invention provides a transistor device. The device includes a substrate and an oxide layer formed on the substrate. The device further includes a wide-bandgap body material formed between a portion of the oxide layer and a gate dielectric layer. The wide-bandgap body material has an energy bandgap of 1.35 eV or higher and is lattice matched to the substrate. The device further includes source-drain material formed on the oxide layer adjacent to the wide-bandgap body material so as to define a heterostructure interface where the source-drain material contacts the wide-bandgap body material. The wide-bandgap body material is also lattice matched to the source-drain material. The device further includes a gate material formed over the gate dielectric layer. In some particular example cases, the device further includes each of a source contact, a drain contact, and a gate contact. In another particular case, the substrate is a silicon bulk substrate or a silicon-on-insulator (SOI) substrate, and the oxide layer is a silicon dioxide layer. In another particular case, the gate dielectric layer extends beyond the wide-bandgap body material. In another particular case, the wide-bandgap body material is p-type body material, and the source-drain material is n-type source-drain material. In another particular case, the wide-bandgap body material has an energy bandgap of 2.0 eV or higher. In another particular case, the wide-bandgap body material is lattice matched to silicon. In another particular case, the wide-bandgap body material has an energy bandgap of 2.0 eV or higher and is lattice matched to silicon. In another particular example case, the wide-bandgap body material comprises aluminum phosphide, gallium phosphide, or gallium arsenide phosphide.

Another embodiment of the present invention provides an integrated circuit transistor device that includes a silicon substrate and a silicon dioxide layer formed on the substrate. The device further includes a wide-bandgap body material formed between a portion of the oxide layer and a gate dielectric layer. The wide-bandgap body material has an energy bandgap of 1.35 eV or higher and is lattice matched to the substrate, and the gate dielectric layer extends beyond the wide-bandgap body material. The device further includes source-drain material formed on the oxide layer adjacent to the wide-bandgap body material so as to define a hetero-structure interface where the source-drain material contacts the wide-bandgap body material. The wide-bandgap body material is also lattice matched to the source-drain material. The device further includes a gate material formed over the gate dielectric layer. In some particular example cases, the device includes each of a source contact, a drain contact, and a gate contact. In one particular case, the substrate is a silicon bulk substrate or a silicon-on-insulator (SOI) substrate, and the oxide layer is a silicon dioxide layer. In another particular case, the wide-bandgap body material is p-type body material, and the source-drain material is n-type source-drain material. In another particular case, the wide-bandgap body material has an energy bandgap of 2.0 eV or higher. In another particular case, the wide-bandgap body material has an energy bandgap of 2.0 eV or higher and is lattice matched to silicon. In another particular case, the wide-bandgap body material comprises aluminum phosphide, gallium phosphide, or gallium arsenide phosphide.

Another embodiment of the present invention provides an integrated circuit chip, which includes a plurality of the transistor devices described herein. In one particular example case, the substrate is a silicon bulk substrate or a silicon-on-insulator (SOI) substrate, and the oxide layer is a silicon dioxide layer, and the wide-bandgap body material has an energy bandgap of 2.0 eV or higher and is lattice matched to silicon. In another particular case, the integrated circuit chip includes 1,000 or more of the transistor devices. In another particular example case, the wide-bandgap body material comprises aluminum phosphide, gallium phosphide, indium phosphide, or gallium arsenide phosphide.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

As will be appreciated, the figures are not drawn to any particular scale or intended to implicate any specific limitations. Rather, the figures are generally drawn to merely facilitate understanding to the example techniques and device structures described herein.

DETAILED DESCRIPTION

A high linearity bandgap engineered transistor device is provided. In one example configuration, the device generally includes a substrate and an oxide layer formed on the substrate. The device further includes a wide-bandgap body material formed between a portion of the oxide layer and a gate dielectric layer. The wide-bandgap body material has an energy bandgap of 1.35 eV or higher and is lattice matched to the substrate. The device further includes a source-drain material formed on the oxide layer adjacent to the wide-bandgap body material so as to define a hetero-structure interface where the source-drain material contacts the wide-bandgap body material. The wide-bandgap body material is also lattice matched to the source-drain material. The device further includes a gate material formed over the gate dielectric layer. Other features and variations will be apparent in light of this disclosure.

General Overview

As previously explained, continued scaling in sub-micron technology nodes for metal oxide semiconductor field effect transistors (MOSFET) gives rise to a number of non-trivial and not well-understood issues. For instance, such scaling causes reduced radio frequency (RF) and microwave power handling (device breakdown voltage) capability in mixed-signal circuits due to intrinsic channel material properties. For instance, wideband receivers generally require large signal swing with simultaneous fast switching speed. Current commercial miniaturized solutions use a strained silicon germanium (SiGe) or germanium (Ge) channel, or a III-V small bandgap channel such as indium gallium arsenide (InGaAs) or gallium arsenide antimonide (GaAsSb) to improve complementary metal oxide semiconductor (CMOS) transistor switching speed at the expense of large signal swing. To this end, simultaneous fast switching and large signal power handling capability remain a long standing limitation for RF CMOS technologies.

Figure 1:
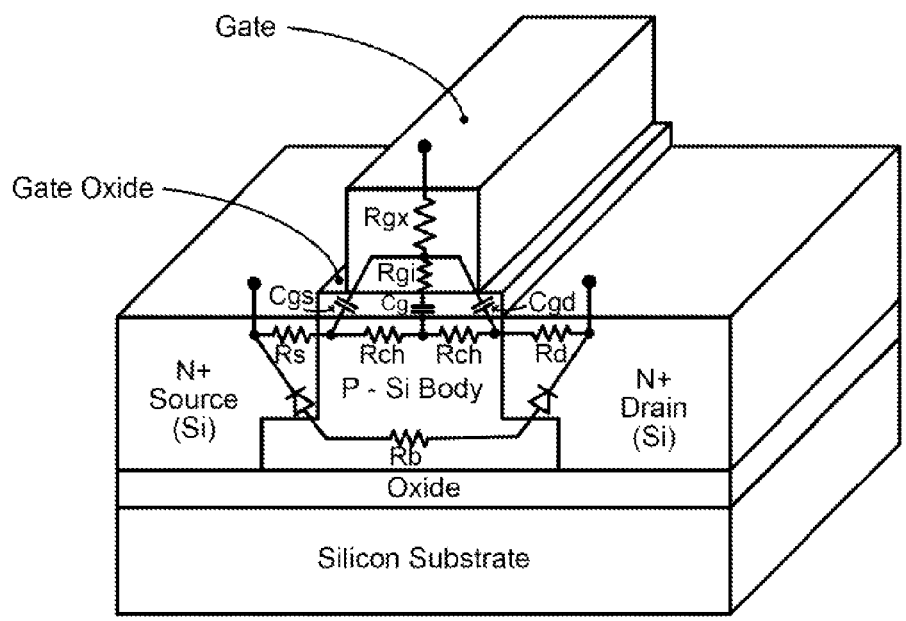
FIG. 1 illustrates a typical MOSFET structure and a number of linearity limitations associated therewith.

FIG. 1 schematically demonstrates example linearity limitations of conventional MOSFET technology. To achieve high transistor switching speed, MOSFET devices generally need a smaller gate length at the expense of breakdown performance. Large signal voltage-swing is a necessary condition to achieve high linearity and the transistor's signal swing breakdown voltage is set by gate-to-drain/drain dielectric breakdown field and source-to-drain barrier leakage. The necessary large signal voltage-swing, however, is not a sufficient condition for high dynamic range applications. As can be seen with the schematic overlay of FIG. 1, a conventional MOSFET structure includes a bias dependent poly-depletion resistance (Rgi), a non-linear junction capacitance (Cgd) at large drain/source-body bias voltages, and non-linear gate capacitances (Cg) during each of accumulation-depletion-inversion. In addition, a MOSFET structure's high output conductance Rch (i.e., 1/gd, where gd is the output conductance) at small gate length is undesirable.

Thus, a number of linearity improvement challenges remain in MOSFET technology, including nonlinear transconductance/conductance, the ability to maintain fast switching speed with improved breakdown characteristics (e.g., small gate length+wider bandgap), minimizing short channel effect, and switching time aberrations (e.g., threshold voltage variation).

In accordance with an embodiment of the present invention, a transistor structure is provided that employs channel bandgap engineering to achieve high linearity and simultaneously maintain transistor switching speed with improved off-state leakage. For instance, and in accordance with one example such embodiment, wide-bandgap channel material such as aluminum phosphide (AlP) or gallium phosphide (GaP) or gallium arsenide phosphide (GaAsP) can be used to improve the device breakdown voltage. Such materials can be lattice matched to the substrate and source-drain materials (e.g., silicon or other suitable materials) to improve material defect and reduce dislocation density for better off-state leakage current. In addition, intrinsic high electron's field effect mobility of the wide-bandgap channel material can be leveraged to help realize high linearity, high speed analog RF CMOS transistors.

Figure 2:
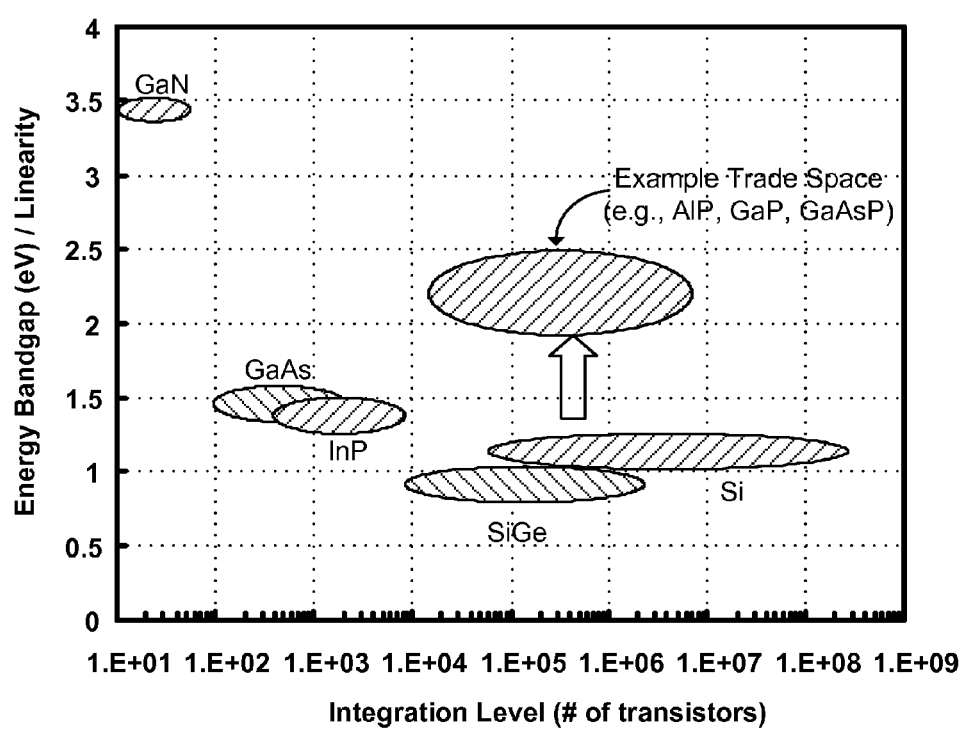
FIG. 2 illustrates a plot showing integration level (based on number of transistors) relative to energy bandgap (eV)/linearity for various semiconductor material systems, including those configured in accordance with some embodiments of the present invention.

FIG. 2 illustrates a plot showing integration level (based on number of transistors) relative to energy bandgap (eV)/linearity for various semiconductor material systems. As can be seen, and in accordance with some example embodiments of the present invention, an example trade space for high linearity and high integration RF applications simultaneously includes an integration level comparable to that of Si and SiGe material systems with an energy bandgap of 2 eV or higher (such as those comparable to compound semiconductors).

The integration level generally refers to transistors per chip, and will depend on the desired functionality of the chip. An example integration level for some embodiments of the present invention ranges from 100 transistors/mm$^2$ to 100,000 transistors/mm$^2$. The integration level associated with the example trade space shown in FIG. 2 ranges from about 10,000 to 10,000,000 transistors per chip, where the chip size is in the range of 1 to 50 mm$^2$ (although lower integration levels, such as 1,000 transistors per chip, can also be implemented). One specific example SoC embodiment has an integration level of 100,000 transistors/mm$^2$, or higher. In one such case, the integration level is 500,000 transistors/mm$^2$.

Aluminum phosphide, gallium phosphide, and gallium arsenide phosphide are three example material systems that fit within that example trade space. Such material systems effectively allow for dynamic range characteristics approaching that of III-V compound semiconductors, while maintaining other benefits of a silicon platform. This heterojunction engineering concept provided herein can thus be used to achieve simultaneous linearity and large-scale integration. Other suitable material systems will be apparent in light of this disclosure, depending on desired degree of integration level and energy bandgap.

As will be further appreciated, the example integration level (transistor # per chip or mm$^2$) and energy bandgap ranges associated with the example trade space shown in the plot of FIG. 2 are not intended to limit the claimed invention. Rather, those example ranges reflect specific example materials that can be used to implement some embodiments of the present invention. Other wide-bandgap channel materials that meet or exceed the example trade space (by way of increased transistor #s and/or energy bandgap) can be used to similar advantage as explained herein. Other example wide-bandgap materials include indium phosphide (InP) and gallium arsenide (GaAs) having respective bandgaps of 1.4 eV and 1.35 eV, each of which is sufficiently higher than the 1.1 eV bandgap of silicon. In general, any material having an energy bandgap of 1.35 eV or higher can be used as the wide-bandgap material. In some embodiments, materials having an energy bandgap of 2.0 eV or higher can be used as the wide-bandgap material.

Thus, a transistor structure configured in accordance with one embodiment of the present invention can be a highly integrated bandgap engineered CMOS transistor and simultaneously provide high speed switching and high linearity. Numerous material systems (e.g., AlP or GaP or GaAsP or InP or GaAs on silicon) and process technologies (e.g., CMOS, n-type MOS, p-type MOS, high electron mobility transistor or HEMT, or heterojunction bipolar transistor or HBT technologies) can be used in implementing such transistor structures as will be apparent in light of this disclosure. A wide-bandgap CMOS structure embodiment as described herein effectively combines large scale integration of CMOS and power handling capability of compound semiconductor devices such HEMT and HBT structures.

The channel-bandgap engineered transistor structures as described herein have use in a wide variety of applications, such as in wibeband RF system-on-chip (SoC) technology. In addition, any number of microelectronics applications that rely on either RF CMOS devices for low power or compound-semiconductor p-type high electron mobility transistor (pHEMT) and/or HBT devices for high speed application may benefit from an embodiment of the present invention. Numerous applications as will be appreciated in light of this disclosure.

Device Structure

Figure 3:
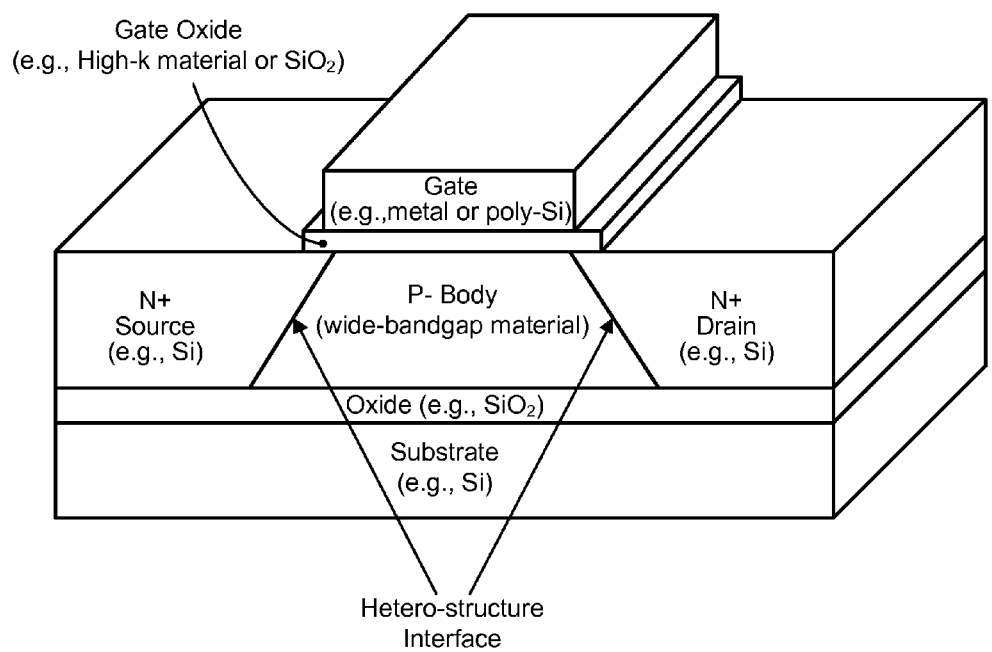
FIG. 3 illustrates a transistor structure configured in accordance with an embodiment of the present invention.

FIG. 3 illustrates a perspective cross-sectional view of a transistor structure configured in accordance with an embodiment of the present invention. As can be seen, the example transistor structure is a hetero-structure NFET implemented on a silicon substrate. As previously explained, a typical n-type MOSFET (n-MOSFET) silicon process incorporates germanium or compound semiconductor materials to enhance the transistor switching speed but not the breakdown voltage.

In accordance with an embodiment of the present invention, a wide-bandgap compound semiconductor material that is lattice matched to silicon (or other desired source-drain material) and has high intrinsic electron mobility can be used. As an example, each of AlP, GaP, InP, GaAs, and GaAsP materials has a large breakdown voltage as well as good electron mobility and can be used to implement the wideband gap p-body material for the example structure shown in FIG. 3.

One of the advantages of using a hetero-structure interface of source-drain to body as shown in FIG. 3 is that it significantly improves the short-channel tunneling leakage (short-channel effects for source-drain) with the heterojunction barrier. In some example such embodiments, either bulk silicon or silicon-on-insulator (SOI) substrates can be used for implementation. A SOI substrate may be particularly useful to reduce body leakage through the silicon substrate (due to body to substrate capacitance). Numerous other suitable substrate materials and configurations can be used as well, and the claimed invention is not intended to be limited to any one substrate material or set of materials or any particular substrate type.

The wide-bandgap p-body material improves source-drain breakdown performance relative to conventional structures. In some embodiments, for instance, materials have an energy bandgap of $Eg_x >> Eg_{Si}$ are used for the wide-bandgap p-body material, wherein power handling associated with $Eg_x$ materials is improved at least one order of magnitude (or better) relative to power handling associated with $Eg_{Si}$. The wide-bandgap material can be provided using standard epitaxial growth and etch processes and can be implemented with materials such as lattice matched AlP ($Eg_x$=2.45 eV), GaP ($Eg_x$=2.27 eV), or GaAsP ($Eg_x$=2.26 eV). Other suitable materials having a bandgap in the range of 1.35 eV to 6.4 eV (or higher) that can lattice match to the substrate and source-drain materials can be used.

Fabrication Methodology

FIGS. 4a-4g illustrate a method for fabricating a transistor structure, in accordance with an embodiment of the present invention. In this example case, the resulting structure is a high linearity CMOS heterojunction N-channel FET, although other device constructions will be apparent in light of this disclosure, and the claimed invention is not intended to be limited to any particular configuration. Rather, any configuration that can benefit from use of a wide-bandgap body material that is lattice matched to the source-drain material and allows for simultaneous fast switching and large signal power handling capability.

Figure 4A:
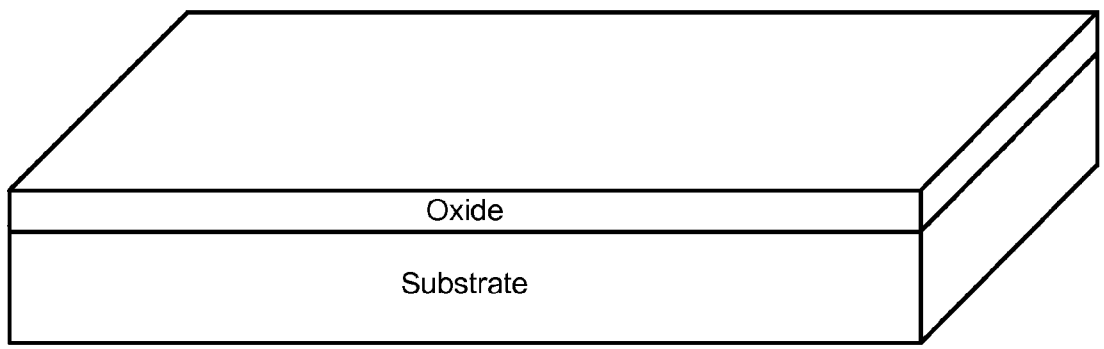
FIGS. 4a-4g illustrate a method for fabricating a transistor structure, in accordance with an embodiment of the present invention.

The method begins with depositing a thin oxide layer on top of the substrate, as shown in FIG. 4a. The oxide layer acts as a non-conductive device isolation layer, and can be grown or otherwise deposited using any standard crystal growth methods such as liquid phase epitaxy (LPE), molecular beam epitaxy (MBE), metal-organic chemical vapor deposition (MOCVD), or oxidation of silicon substrate. As previously explained, the substrate can be, for example, a bulk X substrate or X-on-insulator (XOI) substrate (e.g., X=silicon, silicon germanium, gallium arsenide, or other suitable substrate material). In one specific example embodiment, the substrate is a standard bulk silicon or SOI substrate and the oxide layer is silicon dioxide ($SiO_2$). Other oxide layer materials can be used, depending on the substrate material (e.g., native oxide layer or any oxide material layer that works with the overall material system).

Figure 4B:
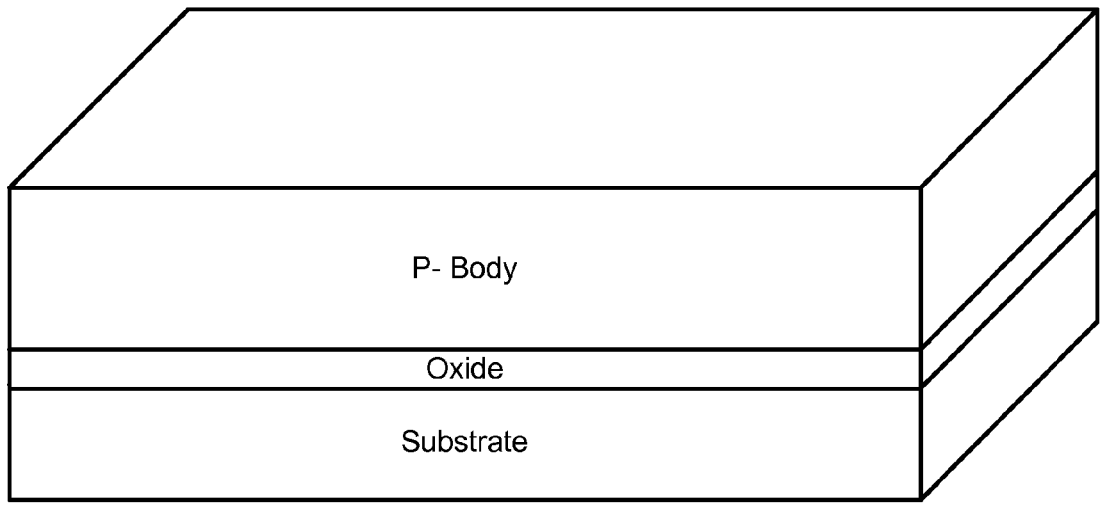

The method of this example embodiment continues with depositing a wide-bandgap, lightly doped p-type body material on the oxide layer, as shown in FIG. 4b. The wide-bandgap can be deposited, for example, using LPE, MBE, or MOCVD processes to form the CMOS channel. Continuing with the specific example embodiment having a silicon substrate and an $SiO_2$ layer, the wide-bandgap p-body material can be AlP, GaP, and GaAsP, or other suitable material having an Eg sufficiently greater than the Eg of Silicon (by one order of magnitude, or higher), such as an Eg of 1.35 eV or higher. The thickness of each of the substrate, oxide, and p-body layers can vary, as will be appreciated in light of this disclosure, and conventional layer thickness ranges are generally fine for many applications.

Figure 4C:
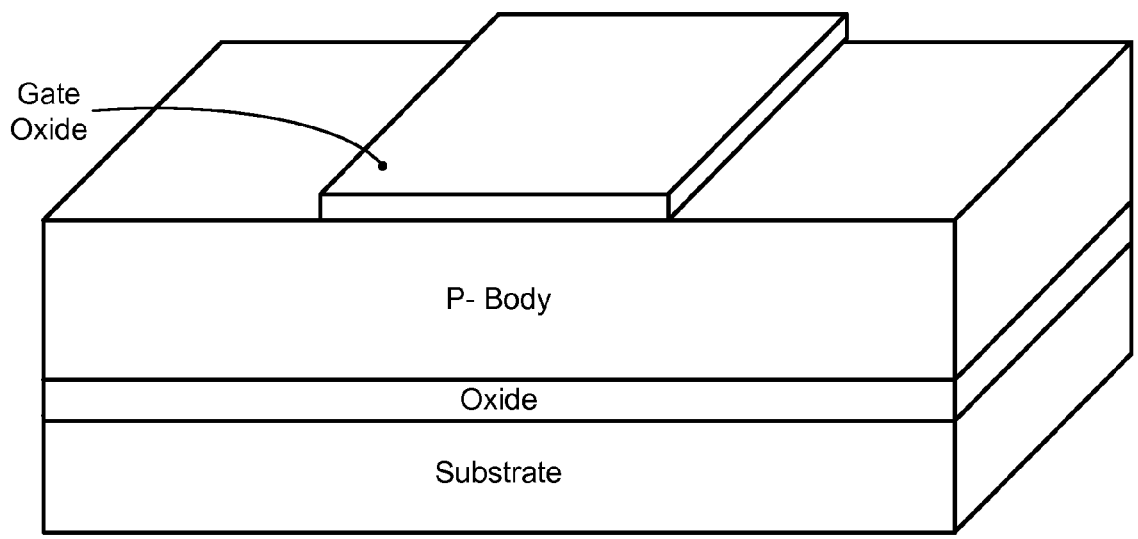

The method continues with depositing and patterning a thin layer of dielectric material on top of p-type material layer, as shown in FIG. 4c. This layer provides the gate oxide, and can be implemented with standard lithography to form desired gate geometry. Continuing with the specific example embodiment having a silicon substrate and an $SiO_2$ layer, the gate oxide can be a grown dielectric layer of $SiO_2$ or high-k material (depending on factors such as the desired degree of gate insulation and the gate oxide layer thickness). Example high-k materials include, for instance, hafnium silicate, hafnium dioxide, zirconium dioxide, and zirconium silicate, which can be deposited using atomic layer deposition as typically done.

Figure 4D:
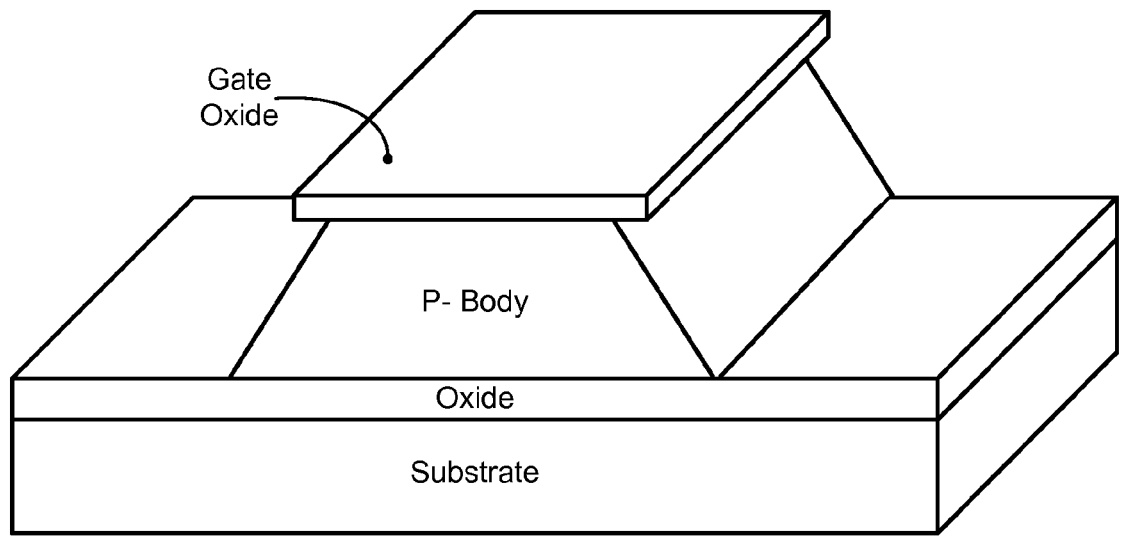

After the gate dielectric/oxide formation, the method continues with etching away the excess wide-bandgap body material using, for example, either wet-chemical etching process or dry plasma etching process, or combination of wet and dry etching while using the gate dielectric material as an etching mask, as shown in FIG. 4d. As can be further seen in FIG. 4d, extra material etching (undercut) underneath the gate dielectric material is desired to have source/drain material overlap with the gate dielectric. In this particular case, the undercut allows an N-channel inversion layer between the source and the drain even if the gate is biased above threshold voltage, Vth. The electron conduction channel is induced with the positive gate biased voltage. Thus, the p-body is slightly smaller than gate dielectric to have electrical conductivity during device operation. The angled aspect of the walls of the remaining body material shown in this example embodiment is due to the crystal plane and etching for compound semiconductor material. In other embodiments, however, the walls may be straight. In general, if the body etching process uses a wet chemical, an angled profile will result. If the body etching process uses a dry plasma such as reactive ion etching (RIE) or inductively coupled plasma etching (ICP), a straight profile will result.

Figure 4E:
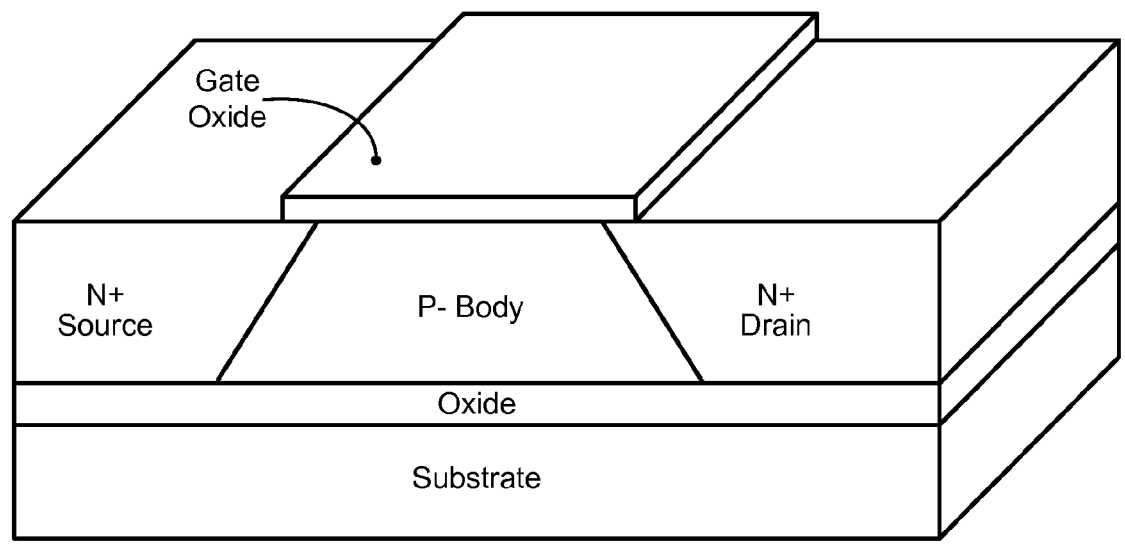

Once the excess wide-bandgap body material has been etched away, the method of this example embodiment continues with depositing the source and drain material using, for example, any suitable epitaxial growth methods (e.g., LPE, MOCVD and/or MBE) to create the n-type source and drain region, as shown in FIG. 4e. The source and drain regions can be doped during the crystal growth process. Epitaxial growth methods such as LPE, MOCVD and MBE can be used to both deposit the lattice matched source-drain material, and add desired N+ doping level using doping elements such as phosphorus and arsenic in the silicon lattice (e.g., dopants can be incorporated during source/drain crystal growth process). A doping activation process can be carried out after the source/drain material deposition at an elevated temperature (e.g., ion-implantation and annealing) to achieve desired doping level. Additional mask layers and processing may be used as necessary. Continuing with the specific example embodiment having a silicon substrate and an $SiO_2$ layer, the source and drain material can be, for instance, silicon doped with phosphorus or arsenic. Other suitable material systems and dopant schemes will be apparent in light of this disclosure.

Figure 4F:
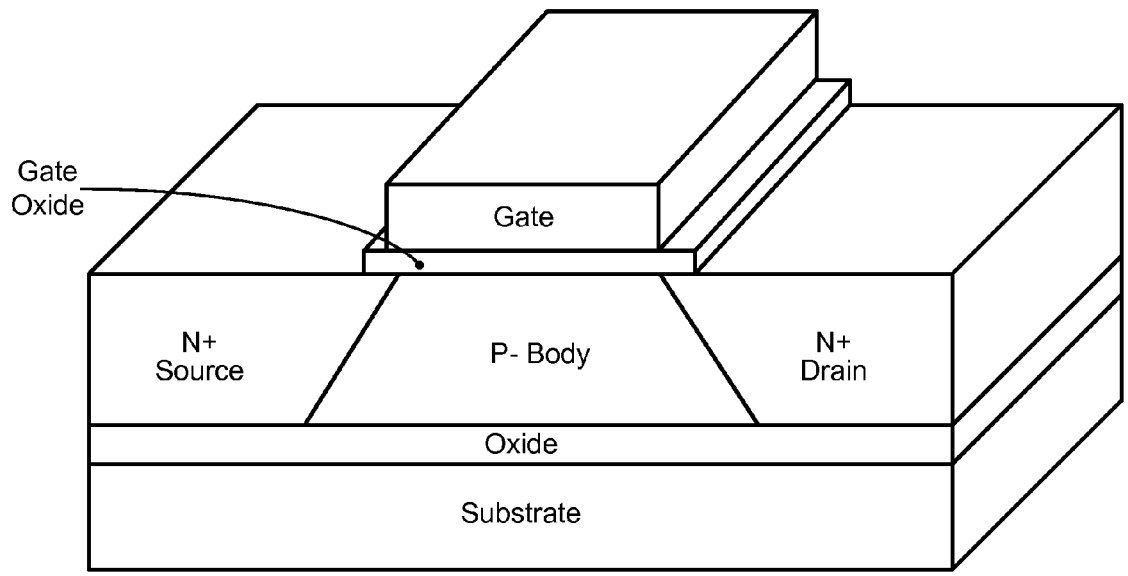
Figure 4G:
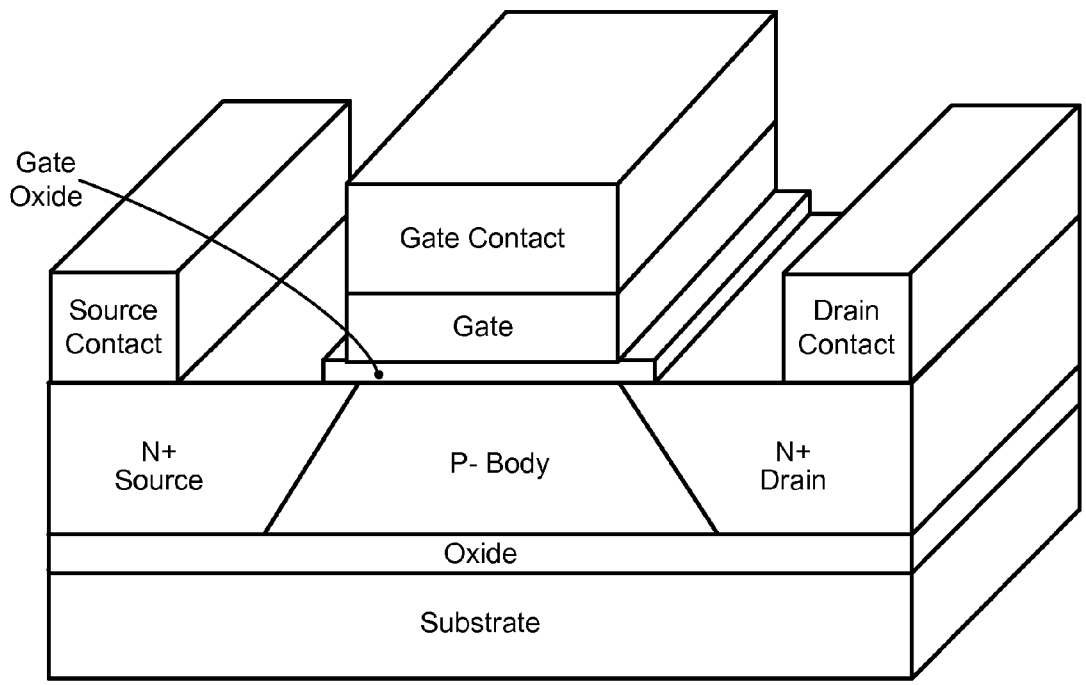

The method of this example embodiment continues with deposition of the gate material using, for example, chemical vapor deposition or a sputtering process, as shown in FIG. 4f. The gate material can be, for instance, metal or poly-silicon or other suitably conductive gate material. The method then continues with deposition of gate, source and drain ohmic contact material to form the device interconnect between the semiconductor source, gate and drain materials to the metal contacts/pads using standard interconnect fabrication processes (e.g., CVD or sputtering of ohmic contact material with post-metallization annealing step), as shown in FIG. 4g. The ohmic contact material can be any number of suitable materials, depending on the structure configuration. For example, a gold-germanium-nickel (Au—Ge—Ni) alloy can be used for n-type ohmic contact to III-V compound semiconductor materials, and a titanium-platinum-gold (Ti—Pt—Au) or palladium-platinum-gold (Pd—Pt—Au) alloy can be used for p-type III-V compound semiconductor materials. For silicon, titanium-aluminum (Ti—Al) can be used for ohmic contact material, or any number of silicides (e.g., silicide of aluminum, nickel, platinum, titanium, and/or tungsten). Ohmic materials are generally used as a low resistance transition layer between semiconductor to metal interface and it is typically a very thin layer. Typically, the ohmic metal is deposited first and then annealed to form the low resistance interface to semiconductor before the contact/pad metal is deposited. The contact/pad metal can be, for instance, aluminum or copper or silver or gold.

FIGS. 5a-5d illustrate leakage improvement provided by a transistor structure configured in accordance with an embodiment of the present invention as compared to a conventional transistor structure. In particular, a cross-sectional energy band diagram view is provided for both a standard N-MOSFET structure and a band-gap engineered hetero NFET structure configured in accordance with one specific embodiment of the present invention.

During the off-state operation (shown in the energy band diagrams of FIGS. 5a and 5c), the conduction band (Ec) offset among the body material to source-drain material of the hetero NFET is formed so that there is an energy barrier to block the electrons (−) from causing undesired leakage between source and drain. Typical deep sub-micron NMOSFETs generally suffer source-drain leakage due to energy barrier lowering and close physical proximity of source and drain material with little or no energy barrier of the lightly doped p-type body material. The hetero-structure interface between the body and source-drain materials in accordance with an embodiment of the present invention will improve leakage current performance since the current is exponentially dependent on the conduction band offset (delta Ec).

Figure 5A:
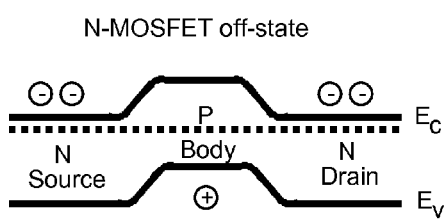
FIGS. 5a-5d illustrate leakage improvement provided by a transistor structure configured in accordance with an embodiment of the present invention as compared to a conventional transistor structure.
Figure 5C:
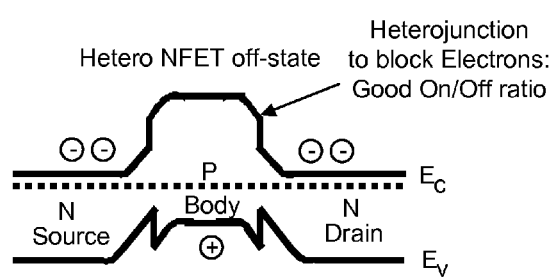
Figure 5B:
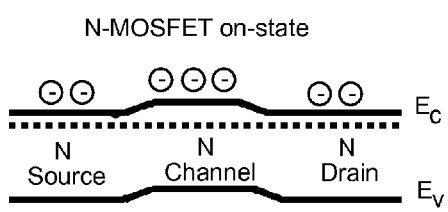
Figure 5D:
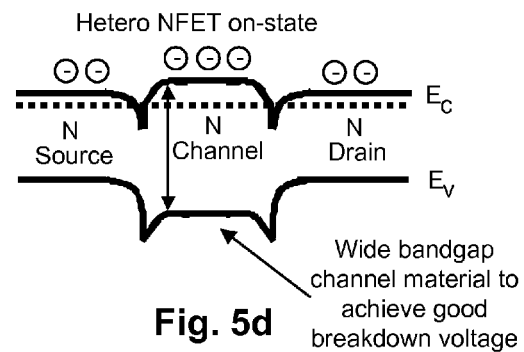

During on-state operation (shown in FIGS. 5b and 5d), the bandgap is pulled down to conduct the channel current and the wide-bandgap body material is effectively used to provide a number of benefits to the device performance such as linearity and power handling (larger breakdown field due to larger energy bandgap). The hetero-structure interface is designed (e.g., band-gap engineering and proper doping concentration) such that there will not be any conduction band energy barrier during on-state operation. The vertical arrow region depicted in FIG. 5d shows that the wide-bandgap energy offset will be transformed from conduction band (Ec) offset during device off-state to the valance band (Ev) offset when the gate bias voltage is applied to the device on-state. As will be appreciated in light of this disclosure, the channel bandgap material can be designed so that there is no barrier spike during device conduction state at the conduction band. The valance band energy spike is tolerable because the hetero NFET structure relies on the single type (electron) majority carrier. Although this hetero concept is shown for an NFET device, the same principle can be readily applied to a PFET device which uses holes as majority carrier.

System-On-Chip

Figure 6:
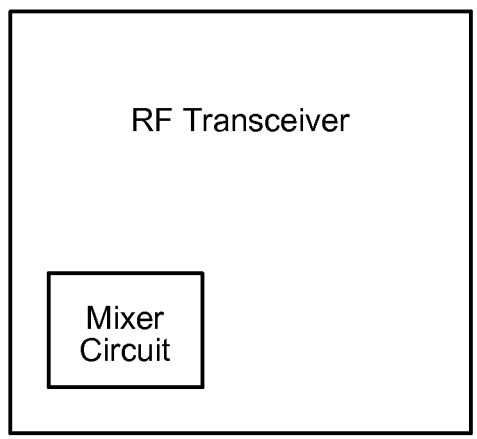
FIG. 6 is an SoC integrated circuit implemented with transistors configured in accordance with an embodiment of the present invention.

FIG. 6 is an SoC integrated circuit implemented with transistors configured in accordance with an embodiment of the present invention. In this example case, the SoC is configured for a transceiver application, but any number of other SoC applications can be implemented, as will be appreciated. The claimed invention is not intended to be limited to any particular SoC application.

As is known, a transceiver is configured with both a transmitter and a receiver that share common circuitry in a single housing (such as a transceiver on a chip). They are typically used in any number of communication applications (e.g., modems, radios, etc). In any case, the transceiver of this example embodiment includes a mixer circuit. In such applications, the mixer is generally used to convert the RF transmission band to IF band in receive direction, or from the IF band to the RF transmission band in the transmit direction. In one example configuration, the mixer circuit includes a Gilbert cell mixer stage and a plurality of input/gain stages implemented with differential pairs. Each input/gain stage has its output connected to the input of the mixer stage (e.g., cascode connected), and is configured to receive an input signal and apply a gain factor (e.g., to provide unity gain, amplification, and/or attenuation) to that input signal to provide a signal for mixing with the LO. Each of the Gilbert cell mixer stage and the input/gain stages can be implemented with transistors as described herein. This will allow the transceiver SoC to simultaneously operate with a high degree of linearity, fast switching speeds, and large signal power handling capability, as will be appreciated in light of this disclosure.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A transistor device, comprising:
   a substrate;
   an oxide layer formed on the substrate;
   a wide-bandgap body material formed between a portion of the oxide layer and a gate dielectric layer, the wide-bandgap body material having an energy bandgap of 1.35 eV or higher and being lattice matched to the substrate;
   source-drain material formed on the oxide layer adjacent to the wide-bandgap body material so as to define a heterostructure interface where the source-drain material contacts the wide-bandgap body material, the wide-bandgap body material also being lattice matched to the source-drain material; and
   a gate material formed over the gate dielectric layer.

2. The device of claim 1, further comprising each of a source contact, a drain contact, and a gate contact.

3. The device of claim 1 wherein the substrate is a silicon bulk substrate or a silicon-on-insulator (SOI) substrate, and the oxide layer is a silicon dioxide layer.

4. The device of claim 1 wherein the gate dielectric layer extends beyond the wide-bandgap body material.

5. The device of claim 1 wherein the wide-bandgap body material is p-type body material, and the source-drain material is n-type source-drain material.

6. The device of claim 1 wherein the wide-bandgap body material has an energy bandgap of 2.0 eV or higher.

7. The device of claim 1 wherein the wide-bandgap body material is lattice matched to silicon.

8. The device of claim 1 wherein the wide-bandgap body material has an energy bandgap of 2.0 eV or higher and is lattice matched to silicon.

9. The device of claim 1 wherein the wide-bandgap body material comprises aluminum phosphide, gallium phosphide, or gallium arsenide phosphide.

10. A transistor device, comprising:
    a silicon substrate;
    a silicon dioxide layer formed on the substrate;
    a wide-bandgap body material formed between a portion of the oxide layer and a gate dielectric layer, the wide-bandgap body material having an energy bandgap of 1.35 eV or higher and being lattice matched to the substrate, wherein the gate dielectric layer extends beyond the wide-bandgap body material;
    source-drain material formed on the oxide layer adjacent to the wide-bandgap body material so as to define a heterostructure interface where the source-drain material contacts the wide-bandgap body material, the wide-bandgap body material also being lattice matched to the source-drain material; and
    a gate material formed over the gate dielectric layer.

11. The device of claim 10, further comprising each of a source contact, a drain contact, and a gate contact.

12. The device of claim 10 wherein the substrate is a silicon bulk substrate or a silicon-on-insulator (SOI) substrate, and the oxide layer is a silicon dioxide layer.

13. The device of claim 10 wherein the wide-bandgap body material is p-type body material, and the source-drain material is n-type source-drain material.

14. The device of claim 10 wherein the wide-bandgap body material has an energy bandgap of 2.0 eV or higher.

15. The device of claim 10 wherein the wide-bandgap body material has an energy bandgap of 2.0 eV or higher and is lattice matched to silicon.

16. The device of claim 10 wherein the wide-bandgap body material comprises aluminum phosphide, gallium phosphide, or gallium arsenide phosphide.

17. An integrated circuit chip, comprising a plurality of the transistor device of claim 10.

18. The integrated circuit chip of claim 17 wherein the substrate is a silicon bulk substrate or a silicon-on-insulator (SOI) substrate, and the oxide layer is a silicon dioxide layer, and the wide-bandgap body material has an energy bandgap of 2.0 eV or higher and is lattice matched to silicon.

19. The integrated circuit chip of claim 17 wherein the integrated circuit chip includes 1,000 or more of the transistor devices.

20. The integrated circuit chip of claim 17 wherein the wide-bandgap body material comprises aluminum phosphide, gallium phosphide, indium phosphide, or gallium arsenide phosphide.

* * * * *